(12) United States Patent
Song et al.

(10) Patent No.: US 9,660,041 B2
(45) Date of Patent: May 23, 2017

(54) ELECTRONIC DEVICE COMPRISING A SEMICONDUCTOR MEMORY UNIT

(71) Applicant: SK hynix Inc., Icheon-Si (KR)

(72) Inventors: Seok-Pyo Song, Icheon-Si (KR); Jae-Yun Yi, Icheon-Si (KR); Se-Dong Kim, Icheon-Si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

(21) Appl. No.: 14/821,457

(22) Filed: Aug. 7, 2015

(65) Prior Publication Data

US 2015/0349074 A1 Dec. 3, 2015

Related U.S. Application Data

(63) Continuation of application No. 14/144,444, filed on Dec. 30, 2013, now Pat. No. 9,105,574.

(30) Foreign Application Priority Data

Mar. 5, 2013 (KR) ........................ 10-2013-0023161

(51) Int. Cl.
| | | |
|---|---|---|
| *H01L 21/00* | (2006.01) | |
| *H01L 27/00* | (2006.01) | |
| *H01L 29/00* | (2006.01) | |
| *H01L 29/423* | (2006.01) | |
| *H01L 27/24* | (2006.01) | |
| *H01L 27/22* | (2006.01) | |
| *H01L 21/8234* | (2006.01) | |

(52) U.S. Cl.
CPC .. *H01L 29/4236* (2013.01); *H01L 21/823418* (2013.01); *H01L 21/823437* (2013.01); *H01L 27/228* (2013.01); *H01L 27/2436* (2013.01)

(58) Field of Classification Search
CPC ..... H01L 21/823418; H01L 21/823437; H01L 27/2436; H01L 27/228; H01L 27/1087; H01L 29/4236; H01L 29/42372; H01L 29/7841; H01L 21/76897
See application file for complete search history.

(56) References Cited

U.S. PATENT DOCUMENTS

| | | | | |
|---|---|---|---|---|
| 7,723,191 | B2* | 5/2010 | Kang | H01L 21/82345 257/E21.429 |
| 8,101,993 | B2* | 1/2012 | Hsieh | H01L 29/0878 257/330 |
| 8,980,714 | B2* | 3/2015 | Lemke | H01L 21/82343 257/331 |
| 2010/0237414 | A1* | 9/2010 | Hsieh | H01L 29/8725 257/337 |
| 2011/0165747 | A1 | 7/2011 | Kim | |

FOREIGN PATENT DOCUMENTS

KR 10-0929634 B1 12/2009

* cited by examiner

*Primary Examiner* — Nikolay Yushin
(74) *Attorney, Agent, or Firm* — Perkins Coie LLP

(57) ABSTRACT

Devices and methods based on disclosed technology include, among others, an electronic device capable of improving a signal transfer characteristic and a method for fabricating the same. Specifically, an electronic device in one implementation includes a plurality of buried gates formed in a substrate, open parts formed in the substrate on both sides of the buried gate, isolation layers each formed between a sidewall of the open part and a sidewall of the buried gate, source/drain regions formed in the substrate under the respective open parts, and contact plugs buried in the respective open parts.

20 Claims, 16 Drawing Sheets

ELECTRONIC DEVICE COMPRISING A SEMICONDUCTOR MEMORY UNIT

CROSS-REFERENCE TO RELATED APPLICATION

The present application is a continuation of, and claims priority and benefits of, U.S. patent application Ser. No. 14/144,444, published as US 2014/0254239, entitled "ELECTRONIC DEVICE COMPRISING A SEMICONDUCTOR MEMORY UNIT," and filed on Dec. 30, 2013, which further claims priority of Korean Patent Application No. 10-2013-0023161, entitled "SEMICONDUCTOR DEVICE AND METHOD FOR MANUFACTURING THE SAME, AND MICRO PROCESSOR, PROCESSOR, SYSTEM, DATA STORAGE SYSTEM AND MEMORY SYSTEM INCLUDING THE SEMICONDUCTOR DEVICE" and filed on Mar. 5, 2013. The contents of the before-mentioned patent applications (including US 2014/0254239) are incorporated herein by reference in their entirety as part of the disclosure of this document.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, electronic devices capable of storing information in various electronic appliances such as a computer, a portable communication device, and so on have been demanded in the art, and research has been conducted for the electronic devices. Such electronic devices include electronic devices which can store data using a characteristic that they are switched between different resistant states according to an applied voltage or current, for example, resistive random access memory (RRAM), phase-change random access memory (PRAM), ferroelectric random access memory (FRAM), magnetic random access memory (MRAM), an E-fuse, etc.

SUMMARY

The disclosed technology in this patent document includes memory circuits or devices and their applications in electronic devices or systems and various implementations of an electronic device using an electronic device capable of improving a signal transfer characteristic and a method for fabricating the same.

In one aspect, an electronic device is provided to a semiconductor memory unit that may include a plurality of buried gates formed in a substrate, open parts formed in the substrate on both sides of the buried gate, isolation layers each formed between a sidewall of the open part and a sidewall of the buried gate, source/drain regions formed in the substrate under the respective open parts, and contact plugs buried in the respective open parts.

Implementations of the above electronic device may include one or more the following.

The semiconductor memory unit may further include an ohmic contact layers formed in the source/drain regions and exposed to the open parts. Each of the buried gates may comprise a trench formed in the substrate; a gate insulating layer formed on a surface of the trench; a gate electrode formed over the gate insulating layer and configured to bury part of the trench; and a sealing layer formed over the gate electrode and configured to bury the remaining trench. A bottom of the open part is lower than an interface where the gate electrode comes in contact with the sealing layer. The isolation layer may comprise an insulating layer. The open parts may comprise: first open parts formed in the substrate on both sides of the buried gate and each configured to have a first critical dimension; and second open parts formed under the first open parts and each configured to have a second critical dimension smaller than the first critical dimension. The isolation layer may comprise a substrate remaining between a sidewall of the second open part and a sidewall of the buried gate. Each of the contact plugs may comprise a metallic layer. The electronic device may further comprise a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory unit that includes the resistance variable element is part of the memory unit in the microprocessor. The electronic device may further comprise a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory unit that includes the resistance variable element is part of the cache memory unit in the processor. The electronic device may further comprise a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory unit that includes the resistance variable element is part of the auxiliary memory device or the main memory device in the processing system. The electronic device may further comprise a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory unit that includes the resistance variable element is part of the storage device or the temporary storage device in the data storage system. The electronic device may further comprise a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory unit that includes the resistance variable element is part of the memory or the buffer memory in the memory system.

In another aspect an electronic device is provided to a semiconductor memory unit that may include a semiconductor memory unit that may include word lines configured to include a plurality of buried gates formed in a substrate, open parts formed in the substrate on both sides of the buried gate, isolation layers each formed between a sidewall of the open part and a sidewall of the buried gate, source/drain regions formed in the substrate under the respective open parts, contact plugs buried in the respective open parts, a source line coupled with the source region, variable resistance elements coupled with the respective drain regions, and bit lines coupled with the respective variable resistance elements. The electronic device may further include ohmic contact layers formed in the source/drain regions and exposed to the open parts. Each of the buried gates may includes a trench formed in the substrate; a gate insulating layer formed on a surface of the trench; a gate electrode formed over the gate insulating layer and configured to bury part of the trench; and a sealing layer formed over the gate electrode and configured to bury the remaining trench. A bottom of the open part may be lower than an interface where the gate electrode comes in contact with the sealing layer. The isolation layer may include an insulating layer. The open parts may includes first open parts formed in the substrate on both sides of the buried gate and each configured to have a first critical dimension; and second open parts formed under the first open parts and each configured to have a second critical dimension smaller than the first critical dimension. The isolation layer may include a substrate remaining between a sidewall of the second open part and a sidewall of the buried gate. Each of the contact plugs may includes a metallic layer. Each of the variable resistance elements may includes a stack layer having a tunnel barrier layer interposed between two magnetic material layers. Each of the variable resistance elements may include metal oxide. Each of the variable resistance elements may includes phase-change materials.

In another aspect, a method is provided for fabricating an electronic device having a semiconductor memory unit. This method includes forming a plurality of buried gates in a substrate, forming first open parts, each having a first critical dimension, by etching the substrate on both sides of the buried gate, forming spacers on both sidewalls of the first open part; forming second open parts, each having a second critical dimension smaller than the first critical dimension, by etching the substrate under the first open parts using the spacers as etch barriers; forming source/drain regions in the substrate under the second open parts, and forming contact plugs configured to bury the first and the second open parts. The method may further include forming ohmic contact layers in surfaces of the source/drain regions exposed to the second open parts before forming the contact plugs. The forming of the ohmic contact layers may includes forming discontinuous metal-containing layers on an entire surface of the substrate; forming silicide in the source/drain regions coming in contact with the metal-containing layers by performing anneal; and removing metal-containing layers that have not reacted. The forming of the discontinuous metal-containing layers on the entire surface of the substrate may be performed using a physical vapor deposition method. The forming of the buried gates may includes: forming trenches by selectively etching the substrate; forming a gate insulating layer on a surface of each of the trenches; forming a gate electrode formed over the gate insulating layer and configured to bury part of the trench; and forming sealing layers each formed over the gate electrode and configured to bury a remaining trench. The forming of the first open parts may includes forming the first open parts so that a bottom of the first open part is higher than an interface where the gate electrode comes in contact with the sealing layer. The forming of the second open parts may includes forming the second open parts so that a bottom of the second open part is lower than an interface where the gate electrode comes in contact with the sealing layer. The forming of the second open parts may includes forming the second open parts so that the substrate remains between a sidewall of the second open part and a sidewall of the buried gate. Each of the contact plugs may includes a metallic layer.

In another aspect, a method is provided for fabricating an electronic device having a semiconductor memory unit. This method includes: forming a plurality of buried gates in a substrate, forming open parts by etching the substrate on both sides of the buried gate, forming isolation layers on both sidewalls of the open part, forming source/drain regions in the substrate under the open parts, and forming contact plugs each configured to bury the open part. The method may further include forming ohmic contact layers in surfaces of the source/drain regions exposed to the second open parts before forming the contact plugs. The forming of the buried gates may includes forming trenches by selectively etching the substrate; forming a gate insulating layer on a surface of each of the trench; forming a gate electrode formed over the gate insulating layer and configured to bury part of the trench; and forming sealing layers each formed over the gate electrode and configured to bury a remaining trench. The forming of the open parts may includes forming the open parts so that a bottom of the open part is lower than an interface where the gate electrode comes in contact with the sealing layer. Each of the isolation layers may includes an insulating layer. Each of the contact plugs may includes a metallic layer.

In another aspect, an electronic device is provided to include a semiconductor memory unit that includes: a substrate; word lines including a plurality of buried gates formed in the substrate; open parts formed in the substrate on two opposing sides of the buried gates; isolation layers formed in the open parts, each isolation layer formed between a sidewall of an open part and a sidewall of a corresponding buried gate; source and drain regions formed in the substrate under respective open parts; contact plugs buried in respective open parts; a source line coupled with the source regions; variable resistance elements coupled with respective drain regions; and bit lines coupled with respective variable resistance elements.

In yet another aspect, an electronic device is provided to include a semiconductor circuit that includes: a substrate; trenches formed in the substrate; conductors located inside the trenches, respectively, to form gate electrodes buried inside the trenches; source and drain regions formed in the substrate and adjacent to the trenches; open parts formed above the source and drain regions on opposing sides of each of the gate electrodes buriend inside respective trenches; isolation layers formed inside the open parts and above respective source and drain regions, each isolation layer formed between a sidewall of an open part and a sidewall of a gate electrode; and contact plugs buried inside the open parts to provide electrical contacts with the source and drain regions, respectively, wherein a gate electrode buried in side a trench and adjacent source and drain regions form a transistor.

These and other aspects, implementations and associated advantages are described in greater detail in the drawings, the description and the claims.

DETAILED DESCRIPTION

Figure 1:
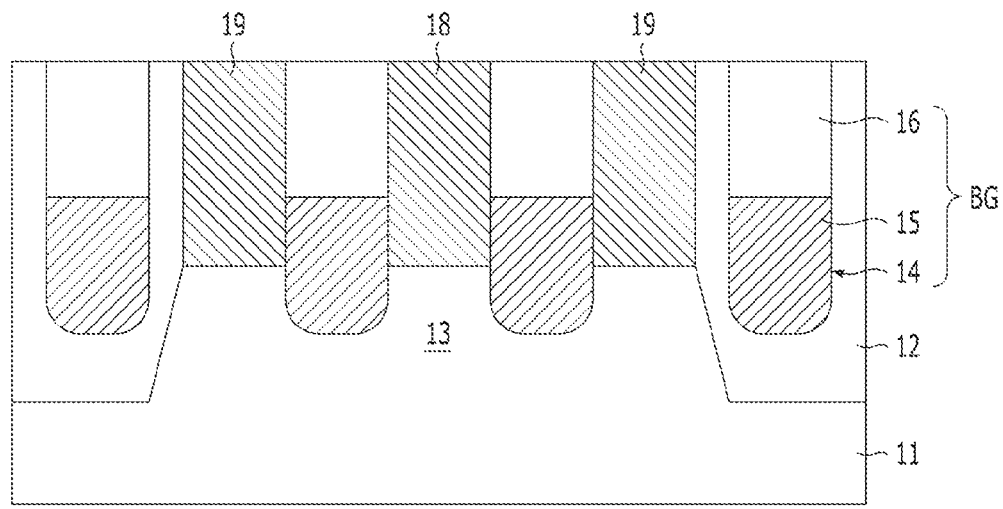
FIGS. 1 and 2 are cross-sectional views of an electronic device including buried gates.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g. one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

The following implementations of the disclosed technology in this patent document can be used to provide an electronic device capable of improving a signal transfer characteristic and a method for fabricating the electronic device. More particularly, the implementations in this patent document can provide an electronic device capable of improving a signal transfer characteristic between a structure coupled with a source region and a structure coupled with a drain region through the source region, a channel region, and the drain region in the electronic device including buried gates and a method for fabricating the electronic device. To this end, the implementations in this patent document can provide an electronic device capable of reducing the resistance of contact parts including source/drain regions and contact plugs and a method for fabricating the electronic device.

For reference, a buried gate formed by burying a gate in a substrate can be used to improve several device characteristics and process implementations due compact nature or fineness in an electronic device fabrication process. A buried gate can be advantageously implemented in a cell architecture having a higher degree of integration than a planar gate (PG) or recess gate (RG) and a process of forming contact plugs and a process of forming conductive lines including bit lines and a source line are easier to implement than circuits based on other gate structures. Furthermore, the buried gate is advantageous in achieving a simpler structure and formation process than a vertical gate (VG) structure. Accordingly, the availability of a buried gate in various circuits can be beneficial in practical electronic devices.

Prior to a description of the implementations of this patent document, an electronic device to be compared with the implementations is described below with reference to FIGS. 1 and 2.

Figure 2:
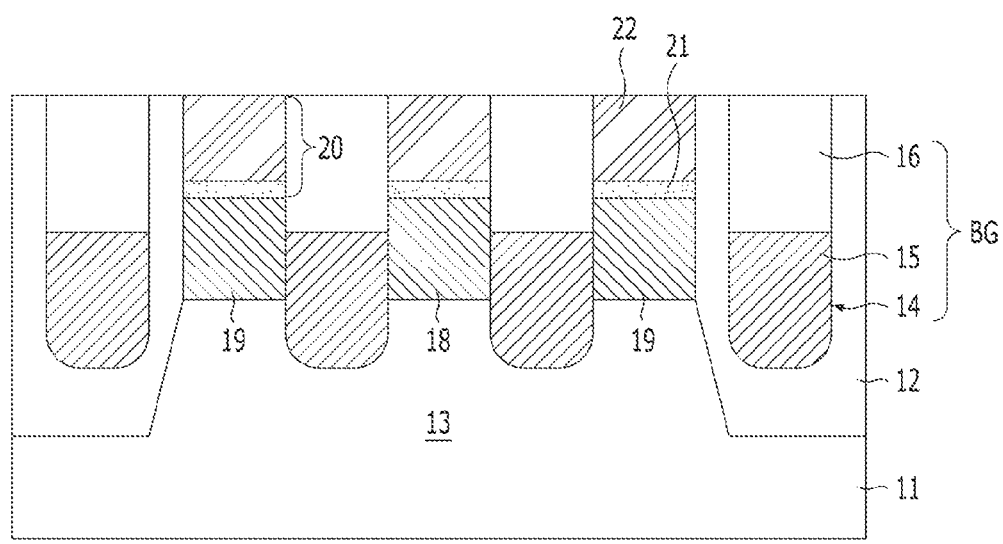

FIGS. 1 and 2 are cross-sectional view of an electronic device including buried gates.

As shown in FIG. 1, first, a plurality of buried gates BG formed in a substrate 11 in which an active region 13 is defined by isolation layers 12. Each of the buried gates includes a trench 14 formed in the substrate 11, a gate insulating layer (not shown) formed on a surface of the trench 14, a gate electrode 15 formed on the gate insulating layer and configured to bury or fill up part of the trench 14, and a sealing layer 16 formed over the gate electrode 15 and configured to bury or fill up the remaining trench 14.

Source and drain regions 18 and 19, that partially overlap with the gate electrodes 15 laterally, are formed in the active region 13 on both opposing sides of the buried gate BG. A transistor is formed by a buried gate and adjacent source and drain regions. In various applications, such a transistor can be electrically coupled to a circuit element as part of the circuitry of the circuit element, e.g., a memory cell. The source and drain regions 18 and 19 for transistors can be formed by, e.g., an impurity ion implantation process. The resistance of the source and drain regions 18 and 19 is reduced by a method of increasing the impurity doping concentrations of the source and drain regions 18 and 19 by increasing the amount of implanted impurities (or a dose) when implanting the impurity ions.

However, a reduction in the resistance of the source and drain regions 18 and 19 is limited because the impurity doping concentrations of the source and drain regions 18 and 19 cannot be increased to or above a specific level due to limited solid solubility although the amount of implanted impurities is increased when implanting impurity ions. For at least this reason, there is a disadvantage in that a signal transfer characteristic transferred to a structure coupled with the source region 18, for example, to a structure coupled with the drain region 19 via the source region 18 and a channel region from a source line (not shown), for example, to storage (not shown) for storing logic information is deteriorated.

In order to address this problem, contact plugs having a lower resistance than the source and drain regions 18 and 19 formed by the impurity ion implantation can be formed in the source and drain regions 18 and 19. This technique is described with reference to FIG. 2.

As shown in FIG. 2, open parts 20 are formed by recessing the active region 13 using the isolation layers 12 and the sealing layers 16 as etch barriers. The source and drain regions 18 and 19 are formed in the active region 13 under the open parts 20 by way of impurity ion implantation. Contact plugs 22 having a lower resistance than the source and drain regions 18 and 19 are buried within the respective open parts 20. Furthermore, an ohmic contact layer 21 is formed between the contact plug 22 and the source region 18 and between the contact plug 22 and the drain region 19. As compared with the electronic device of FIG. 1, in the electronic device of FIG. 2, the volume of the source or drain region 18 or 19 is reduced, and an improved signal transfer characteristic can be implemented because the contact plugs 22 corresponding to the reduced volume are formed.

If the ohmic contact layer 21 laterally overlaps with the gate electrode 15 and the contact plug 22 laterally overlaps with the gate electrode 15 and thus the ohmic contact layer 21 and the contact plug 22 come in contact with the gate insulating layer, however, there is a disadvantage in that reliability, such as a reduction in the breakdown voltage of the electronic device, is deteriorated. As a result, the improvement of a signal transfer characteristic is limited because the bottom of the open part 20 in which the contact plug 22 is buried cannot be placed deep under an interface where the gate electrode 15 comes in contact with the sealing layer 16.

The following implementations and examples are provided based on the disclosed technology to improve a signal transfer characteristic in aforementioned electronic devices in FIGS. 1 and 2.

Figure 3:
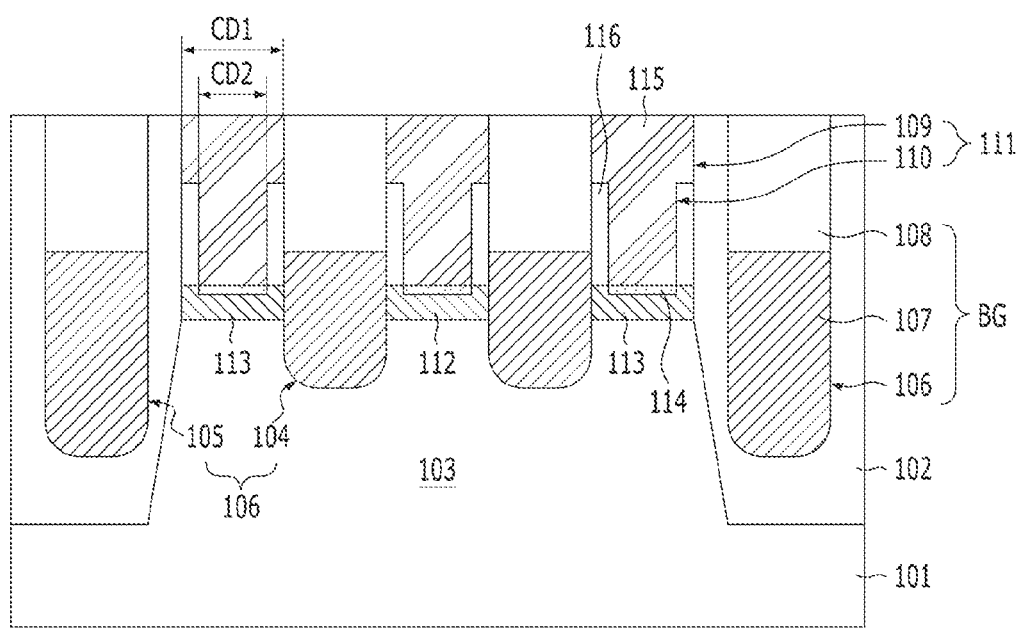
FIG. 3 is a cross-sectional view of an electronic device including buried gates in accordance with an implementation of this patent document.

FIG. 3 is a cross-sectional view of an electronic device including buried gates in accordance with an implementation of this patent document.

As shown in FIG. 3, the electronic device includes a plurality of buried gates BG formed in a substrate 101, open parts 111 formed in the substrate 101 on both sides of the buried gate BG, isolation layers 116 disposed between the sidewalls of the open parts 111 and the sidewalls of the buried gates BG, source/drain regions 112 and 113 formed in the substrate 101 under the open parts 111, ohmic contact layers 114 formed in surfaces of the source/drain regions 112 and 113 which are exposed to the open parts 111, and contact plugs 115 buried in the respective open parts 111.

The substrate 101 can include single crystalline materials. The substrate 101 can further include silicon-containing materials. As a result, the substrate 101 can include single crystalline silicon. Furthermore, the substrate 101 can include active regions 103 isolated from one another by the isolation layers 102. The isolation layers 102 may have been formed by a shallow trench isolation (STI) process.

Each of the buried gates BG can include a trench 106 formed in the substrate 101, a gate insulating layer (not shown) formed on a surface of the trench 106, a gate electrode 107 formed on the gate insulating layer and configured to bury or fill up part of the trench 106, and a sealing layer 108 formed over the gate electrode 107 and configured to bury or fill up the remaining trench 106. The trenches 106 can have a line pattern that intersects both the isolation layers 102 and the active region 103. The trenches 106 can include first trenches 104 formed in the active region 103 and second trenches 105 formed in the isolation layers 102. The first trench 104 can have the same depth as the second trench 105, or the second trench 105 can have a greater depth than the first trench 104. If the second trench 105 has a greater depth than the first trench 104, gate control capability can be increased because the active region 103 under the first trenches 104 has a fin structure. The gate electrode 107 can include a metallic layer. The metallic layer is a conductive layer including metal, and the metallic layer can include a metal layer, a metal oxide layer, a metal nitride layer and so on. The sealing layer 108 can include an insulating layer.

Each of the open parts 111 can include a first open part 109 configured to have a first critical dimension CD1 and a second open part 110 formed under the first open part 109 and configured to have a second critical dimension CD2 than the first critical dimension CD1. The substrate 101 remains between the sidewalls of the second open part 110 and the sidewalls of the buried gate BG, and the remaining substrates 101 function as the isolation layers 116. The isolation layer 116 functions to separate the contact plug 115 and the buried gate BG, in particular, the contact plug 115 and the gate electrode 107.

In some implementations, the first critical dimension CD1 of the first open part 109 can be identical to an interval between the buried gates BG, and the bottom of the first open part 109 can be higher than an interface where the gate electrode 107 comes in contact with the sealing layer 108. In this case, a signal transfer characteristic can be improved and the contact plug 115 can be prevented from overlapping with the gate electrode 107 in a lateral direction because a maximum space where the contact plug 115 can be formed is provided. The second critical dimension CD2 of the second open part 110 is for forming the isolation layer 116 including the substrate 101. Furthermore, the bottom of the second open part 110 can be lower than an interface where the gate electrode 107 comes in contact with the sealing layer 108. In this case, a signal transfer characteristic can be improved because the depth of the open part 111 is increased and thus a maximum space where the contact plug 115 is formed can be provided.

The source/drain regions 112 and 113 are formed in the substrate 101 under the second open part 110 having a bottom lower than an interface where the gate electrode 107 comes in contact with the sealing layer 108. The source/drain regions 112 and 113 are configured to overlap with the gate electrodes 107 in a lateral direction. Since the source/drain regions 112 and 113 are formed in the substrate 101 under the second open parts 110, the volume of the source or drain region 112 or 113 can be reduced comparison with the electronic devices of FIGS. 1 and 2. As a result, a signal transfer characteristic can be effectively improved. The source/drain regions 112 and 113 can be impurity regions formed by doping impurities into the substrate 101.

The ohmic contact layer 114 functions to reduce contact resistance between the contact plug 115 and the source or drain region 112 or 113 and can include silicide. More particularly, in some implementations, the ohmic contact layer 114 can include a suitable material such as a silicide including a near-noble metal or refractory metal, such as titanium silicide ($TiSi_x$), tungsten silicide ($WSi_x$), cobalt silicide ($CoSi_x$), and nickel silicide ($NiSi_x$).

The contact plug 115 buried in the first open part 109 and the second open part 110 includes materials having lower resistance than those of the source/drain regions 112 and 113. More particularly, the contact plug 115 can be formed of a metallic layer.

In such an electronic device, the isolation layers 116 are disposed between the sidewalls of the second open part 110 having a bottom lower than an interface where the gate electrode 107 comes in contact with the sealing layer 108 and the sidewalls of the buried gate BG. Accordingly, since the depth of the open part 111 in which the contact plug 115 is formed is increased, a signal transfer characteristic can be improved, and the deterioration of the characteristics of the electronic device and a reduction in the reliability of the electronic device attributable to the contact plug 115 can be prevented.

FIGS. 4A to 4G are process-sectional views illustrating a method for fabricating an electronic device including buried gates in accordance with one implementation. An example of a method for fabricating an electronic device having the structure of FIG. 3 is described below with reference to FIGS. 4A to 4G.

Figure 4A:
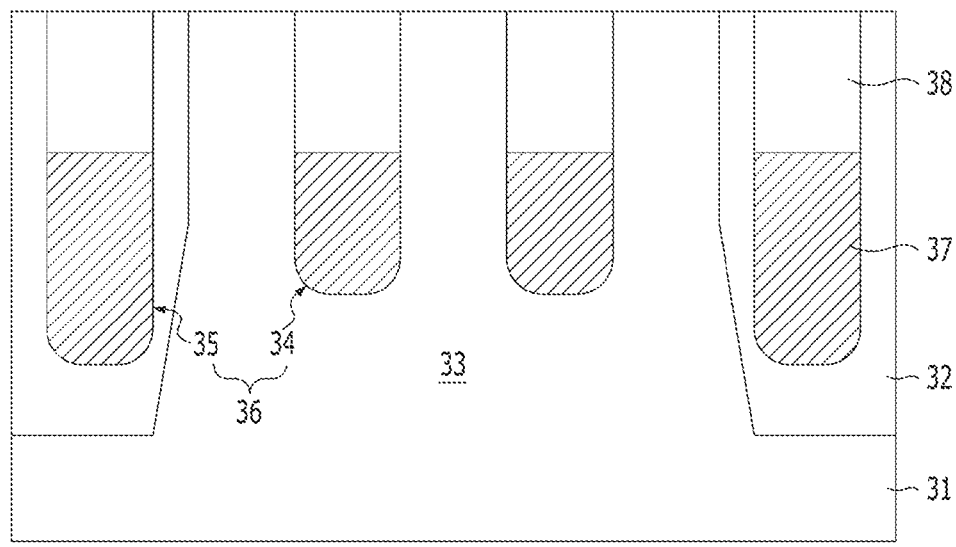
FIGS. 4A to 4G are process-sectional views illustrating a method for fabricating an electronic device including buried gates in accordance with an implementation of this patent document.

As shown in FIG. 4A, isolation layers 32 that define an active region 33 are formed in a substrate 31. The substrate 31 can include single crystalline materials. The substrate 31 can further include silicon-containing materials. For example, the substrate 31 can include single crystalline silicon. The isolation layers 32 can be formed by a shallow trench isolation (STI) process and can include, e.g., an oxide layer or a nitride layer.

A plurality of trenches 36 is formed by selectively etching the substrate 31. The etch process for forming the trenches 36 can include anisotropic etch. The trenches 36 can have a line pattern that intersects both the active region 33 and the isolation layers 32. Here, the trenches 36 can include first trenches 34 formed in the active region 33 and second trenches 35 formed in the isolation layers 32, and the second trench 35 can have a greater depth than the first trench 34. If the second trench 35 has a greater depth than the first trench 34, the active region 33 having a fin structure under the first trenches 34 can be formed.

A gate insulating layer (not shown) is formed on the trench 36. The gate insulating layer can be formed of an oxide layer. The gate insulating layer can be formed by an oxidization process including thermal oxidization or radical oxidization.

Next, gate electrodes 37, each burying part of the trench 36, are formed. The gate electrodes 37 are formed to cover the active region 33 having a fin structure under the first trenches 34 in such a way as to bury both the first trenches 34 and the second trenches 35, thereby being capable of improving gate control capability.

The gate electrode 37 can include a metallic layer. The metallic layer can be a conductive layer containing metal and can include a metal layer, a metal oxide layer, and a metal nitride layer. The gate electrodes 37 can be formed by a series of processes of forming a gate conductive layer on the entire surface of the substrate 31 so that the trenches 36 are partially buried with the gate conductive layer and then sequentially a polishing process and a blanket etch process. The polishing process can be performed using a chemical mechanical polishing (CMP) method, and the blanket etch process can be performed using etch-back.

Sealing layers 38, each burying the remaining trench 36, are formed over the respective gate electrodes 37. The sealing layer 38 can include an insulating layer. The sealing layer 38 can be formed of a single layer or a stack layer of two or more layers by using an oxide layer, a nitride layer, or an oxide nitride layer. The sealing layer 38 can be formed by a series of processes of forming an insulating layer on the entire surface of the substrate 31 so that the trenches 36 are buried with the insulating layer and then performing a polishing process until a surface of the substrate 31 is exposed. The polishing process can be performed using a chemical mechanical polishing (CMP) method or etch-back.

Upon completion of the above processing, a plurality of buried gates BG can be formed and each such BG includes the trench 36, the gate insulating layer (not shown), the gate electrode 37, and the sealing layer 38.

Figure 4B:
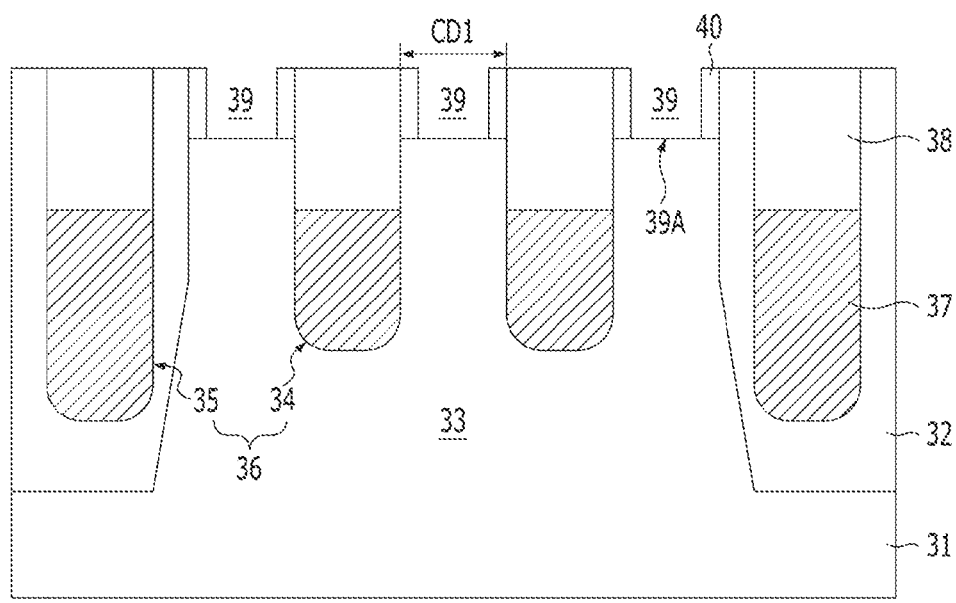

As shown in FIG. 4B, first open parts 39 are formed by recessing the substrate 31 using the isolation layers 32 and the sealing layers 38 as etch barriers. The bottom 39A of the first open part 39 is formed to be higher than an interface where the sealing layer 38 comes in contact with the gate electrode 37. The first open part 39 has a first critical dimension CD1.

Spacers 40 are formed on both sidewalls of the first open part 39. The spacer 40 can be formed of an insulating layer. The spacer 40 can include an oxide layer, a nitride layer, an oxide nitride layer, or a carbon-containing layer. The spacer 40 is made of materials having etch selectivity to the isolation layer 32 and the sealing layer 38. For example, the spacer 40 can be formed of a carbon-containing layer, and the carbon-containing layer can be an amorphous carbon layer.

The spacers 40 can be formed by forming an insulating layer having a constant thickness on a surface of the structure including the first open parts 39 and then performing a blanket etch process, for example, etch-back.

Figure 4C:
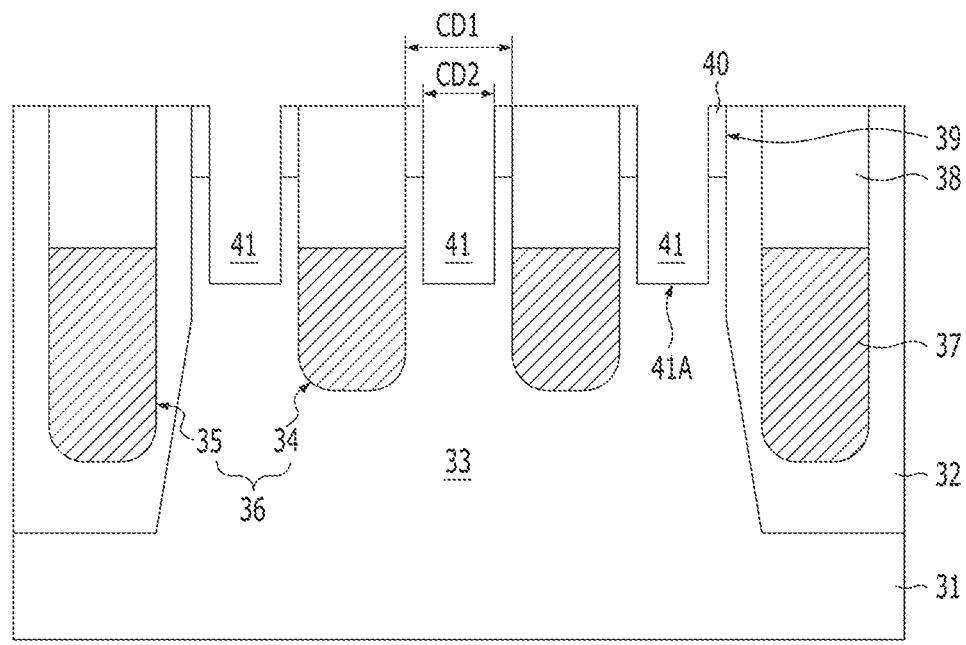

As shown in FIG. 4C4C, second open parts 41 are formed by etching the substrate 31 using the spacers 40 as etch barriers. Each of the second open parts 41 is coupled with the first open part 39, and the bottom 41A of the second open part 41 can be formed to be identical with or lower than an interface where the sealing layer 38 comes in contact with the gate electrode 37.

The second open part 41 has a second critical dimension CD2 smaller than the first critical dimension CD1 of the first open part 39. Since the second open part 41 has the second critical dimension CD2 smaller than the first critical dimension CD1, the substrate 31 remains between the sidewalls of the open part and the sidewalls of the buried gate BG. The substrate 31 that remains between the sidewalls of the second open parts 41 and the sidewalls of the buried gates BG, in particular, the substrate 31 that remains between the sidewalls of the second open parts 41 and the sidewalls of the gate electrode 37 functions as an isolation layer for isolating a contact plug to be formed by a subsequent process from the gate electrode 37. Accordingly, reliability of the electronic device can be improved.

Figure 4D:
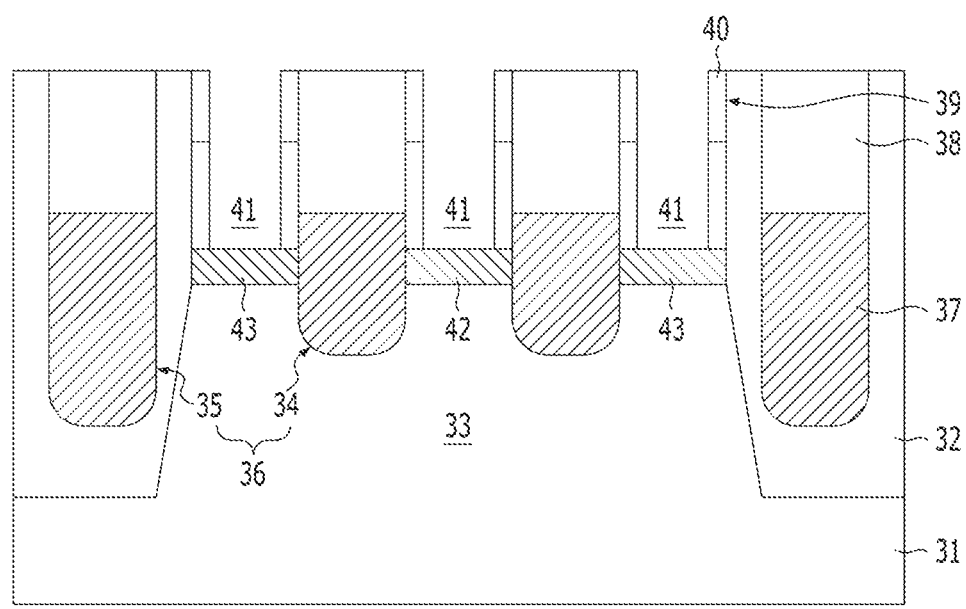

As shown in FIG. 4D, a source region 42 and drain regions 43 are formed by implanting ion impurities into the active region 33 under the second open parts 41 and then performing annealing. N-type impurities, such as phosphorous (P) or arsenic (As), or P-type impurities, such as boron (B), can be used as the impurities for forming the source and drain regions 42 and 43. The impurities for forming the source and drain regions 42 and 43 can be selected depending on the characteristics of an electronic device. The annealing for activating the implanted impurities can be rapid thermal anneal. The source and drain regions 42 and 43 are configured to partially overlap with the gate electrodes 37 in a lateral direction.

The volume of the source or drain region 42 or 43 can be reduced in comparison with the devices in FIGS. 1 and 2 because the source and drain regions 42 and 43 are formed after forming the second open parts 41. This means that a space where a contact plug will be formed by a subsequent process is increased. That is, a signal transfer characteristic of the electronic device can be improved because a space where a contact plug including materials having lower resistance than those of the source or drain region 42 or 43 will be formed is increased.

Figure 4E:
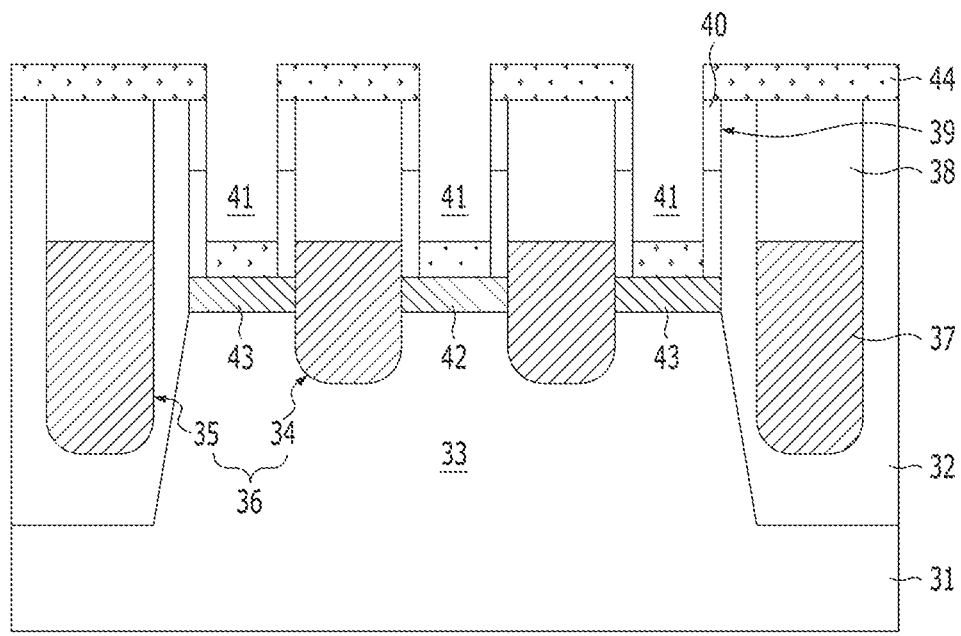

As shown in FIG. 4E, discontinuous metal-containing layers 44 are formed on the entire surface of the substrate 31. The reason why the metal-containing layers 44 are discontinuously formed is to form ohmic contact layers only in the source and drain regions 42 and 43 under the second open parts 41. In some implementations, the metal-containing layers 44 can be formed using a physical vapor deposition (PVD) method capable of easily controlling step coverage.

The metal-containing layer 44 can include metal, such as near-noble metal or refractory metal. More particularly, the metal-containing layer 44 can include cobalt (Co), titanium (Ti), tantalum (Ta), nickel (Ni), tungsten (W), platinum (Pt), or palladium (Pd).

Figure 4F:
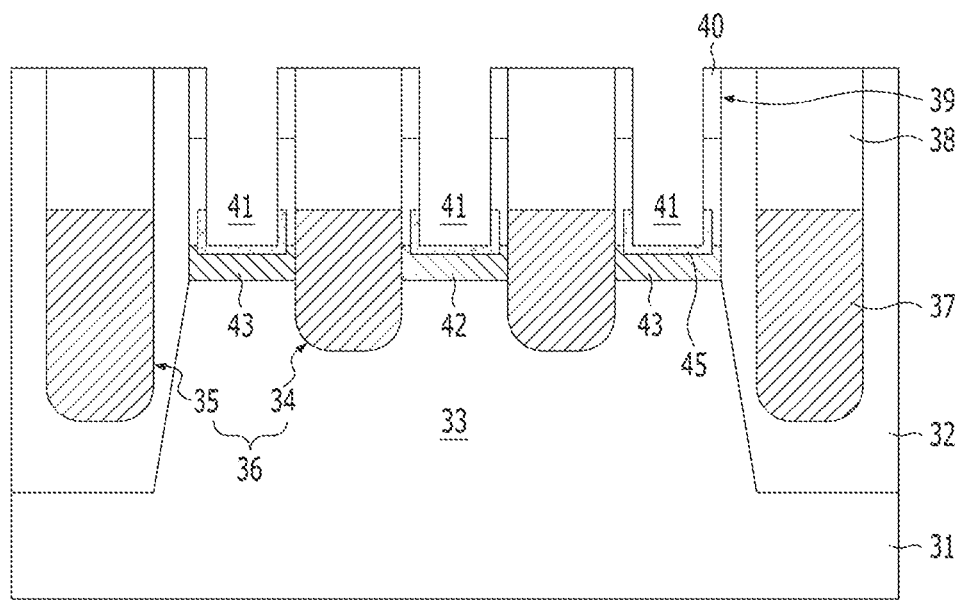

As shown in FIG. 4F, silicide is formed on surfaces of the source and drain regions 42 and 43, exposed to the second open parts 41, by performing anneal. The silicides function as ohmic contact layers 45. Here, the process time is controlled such that the ohmic contact layer 45 does not come in contact with the gate insulating layer (not shown) that comes in contact with the gate electrode 37. That is, the process time is controlled so that the substrate 31 functioning as the isolation layer remains between the sidewalls of the ohmic contact layer 45 and the gate electrode 37. In this case, the ohmic contact layer 45 can prevent the characteristics of the gate insulating layer from being deteriorated. Furthermore, the ohmic contact layer 45 can prevent reliability of the electronic device from being deteriorated.

The annealing can be a rapid thermal annealing process and can be performed at a different temperature depending on the type (or materials) of metal-containing layer 44 and substrate 31. In some implementations, the annealing may be performed several times at different temperatures depending on the type (or materials) of metal-containing layer 44 and substrate 31.

Next, the metal-containing layers 44 that have not reacted are removed. The metal-containing layers 44 that have not reacted can be removed using a mixed chemical of sulphuric acid ($H_2SO_4$) and hydrogen peroxide ($H_2O_2$).

In the process of forming the metal-containing layers 44, the metal-containing layer 44 may also be deposited on the sidewalls of the second open parts 41. However, although the metal-containing layer 44 is deposited on the sidewalls of the second open parts 41, the thickness of the metal-containing layer 44 tends to be small because the metal-containing layers 44 are discontinuously formed using a physical vapor deposition method. Accordingly, although the silicide is formed on the sidewalls of the second open parts 41, the silicide is a negligible level in terms of a characteristic because the thickness of the silicide is very small. As a result, the substrate 31 functioning as the isolation layers still remains between the sidewalls of the second open parts 41 and the sidewalls of the buried gates BG.

Figure 4G:
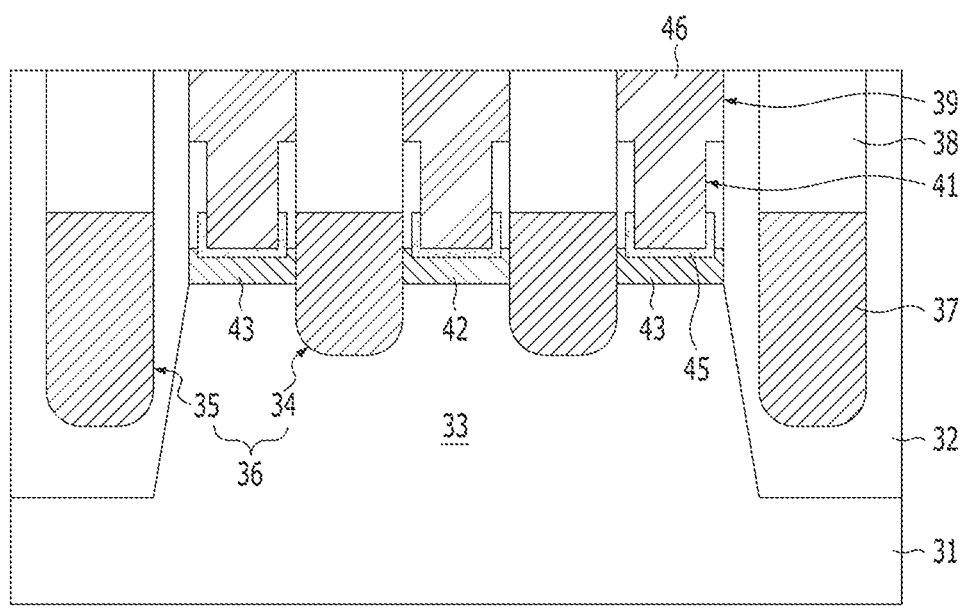

As shown in FIG. 4G, the spacers 40 are removed in order to increase a space where a contact plug 46 will be formed. The spacers 40 can be removed by wet etch or dry etch.

Next, the plurality of contact plugs 46 is formed by forming conductive materials on the entire surface of the substrate 31 so that the first open parts 39 and the second open parts 41 are buried or filled up and then a polishing process is performed to expose the sealing layers 38. The polishing process can be performed using a chemical mechanical polishing (CMP) method. The contact plug 46 is made of conductive materials having lower resistance than the source or drain region 42 or 43. More particularly, the contact plug 46 can be formed of a metallic layer.

The volume of the contact plug 46 can be significantly increased in comprarison with the devices in FIGS. 1 and 2 because the contact plug 46 is configured to bury the first open part 39 and the second open part 41, with the result that a signal transfer characteristic of the electronic device can be improved. Furthermore, since the substrate 31 functioning as the isolation layers remains between the sidewalls of the second open parts 41 and the sidewalls of the buried gates BG, reduction can be achieved in the deterioration of the characteristics of the electronic device that may occur because the ohmic contact layer 45 and the contact plug 46 come in contact with the gate electrode 37.

Figure 5:
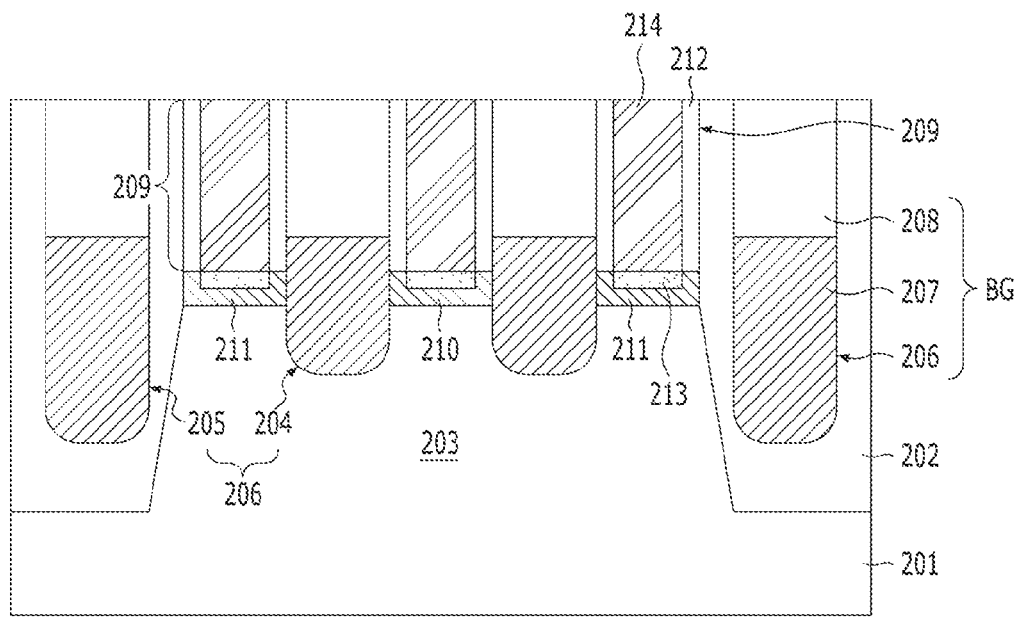
FIG. 5 is a cross-sectional view of an electronic device including buried gates in accordance with another implementation of this patent document.

FIG. 5 is a cross-sectional view of an electronic device including buried gates in accordance with another implementation.

As shown in FIG. 5, the electronic device includes a plurality of buried gates BG formed in a substrate 201, open parts 209 formed in the substrate 201 on both sides of the buried gate BG, isolation layers 212 formed on the sidewalls of the open parts 209 and the sidewalls of the buried gates BG, source and drain regions 210 and 211 formed in the substrate 201 under the open parts 209, ohmic contact layers 213 formed in surfaces of the source and drain regions 210 and 211 exposed to the open parts 209, and contact plugs 214 buried in the respective open parts 209.

The substrate 201 can include single crystalline materials. The substrate 201 can further include silicon-containing materials. For example, the substrate 201 can include single crystalline silicon. The substrate 201 can further include active regions 203 isolated from one another by isolation layers 202. The isolation layers 202 may have been formed by a shallow trench isolation (STI) process.

Each of the buried gates BG can include a trench 206 formed in the substrate 201, a gate insulating layer (not shown) formed on a surface of the trench 206, a gate electrode 207 formed on the gate insulating layer and configured to bury or fill up part of the trench 206, and a sealing layer 208 formed over the gate electrode 207 and configured to bury or fill up the remaining trench 206. The trenches 206 can have a line pattern that intersects both the isolation layers 202 and the active region 203. The trenches 206 can include first trenches 204 formed in the active region 203 and second trenches 205 formed in the isolation layers 202. The first trench 204 can have the same depth as the second trench 205, or the second trench 205 can have a greater depth than the first trench 204. If the second trench 205 has a greater depth than the first trench 204, gate control capability can be increased because the active region 203 under the first trenches 204 has a fin structure. The gate electrode 207 can include a metallic layer, and the sealing layer 208 can include an insulating layer.

A critical dimension of the open part 209 can be identical with an interval between the buried gates BG, and the bottom of the open part 209 can be lower than an interface where the gate electrode 207 comes in contact with the sealing layer 208. In this case, a signal transfer characteristic can be improved because a maximum space where the contact plug 214 will be formed is provided.

Although the bottom of the open part 209 is lower than the interface where the gate electrode 207 comes in contact with the sealing layer 208, the isolation layers 212 formed on the sidewalls of the open part 209 can prevent the deterioration of characteristics and reliability, which is attributable to the overlapping of the contact plug 214 with the gate electrode 207 in a lateral direction. Accordingly, the isolation layer 212 can include an insulating layer. The insulating layer can include an oxide layer, a nitride layer, or an oxide nitride layer. Here, in order to reduce parasitic capacitance between the gate electrode 207 and the contact plug 214, the isolation layer 212 can be an insulating layer having a low dielectric constant. The insulating layer having a low dielectric constant has a lower dielectric constant than a silicon oxide layer.

The source and drain regions 210 and 211 are formed in the substrate 201 under the open parts 209 having bottoms that are lower than the interfaces where the gate electrodes 207 come in contact with the sealing layers 208. The source and drain regions 210 and 211 are configured to overlap with the gate electrodes 207 in a lateral direction. The volume of the source or drain region 210 or 211 can be minimized as compared with the comparison example because the source and drain regions 210 and 211 are formed in the substrate 201 under the open parts 209, thereby being capable of improving a signal transfer characteristic more effectively. The source and drain regions 210 and 211 can be impurity regions formed by doping impurities into the substrate 201.

The ohmic contact layer 213 functions to reduce contact resistance between the contact plug 214 and the source or drain region 210 or 211 and can include silicide. The ohmic contact layer 213 can include silicide including near-noble metal and refractory metal, such as titanium silicide ($TiSi_x$), tungsten silicide ($WSi_x$), cobalt silicide ($CoSi_x$), and nickel silicide ($NiSi_x$).

The contact plug 214 buried in the open part 209 includes a material having a lower resistance than those of the source or drain region 210 or 211. More particularly, the contact plug 214 can be formed of a metallic layer.

The electronic device includes the isolation layers 212 between the sidewalls of the open parts 209, each having a bottom lower than the interface where the gate electrode 207 comes in contact with the sealing layer 208, and the sidewalls of the buried gates BG. Accordingly, a signal transfer characteristic can be improved and the deterioration of characteristics and reliability of the electronic device attributable to the contact plug 214 can also be prevented because the depth of the open part 209 where the contact plug 214 is formed is increased.

FIGS. 6A to 6E are process-sectional views illustrating a method for fabricating an electronic device including buried gates in accordance with another implementation. An example of a method for fabricating an electronic device having the structure of FIG. 5 is described below with reference to FIGS. 6A to 6E.

Figure 6A:
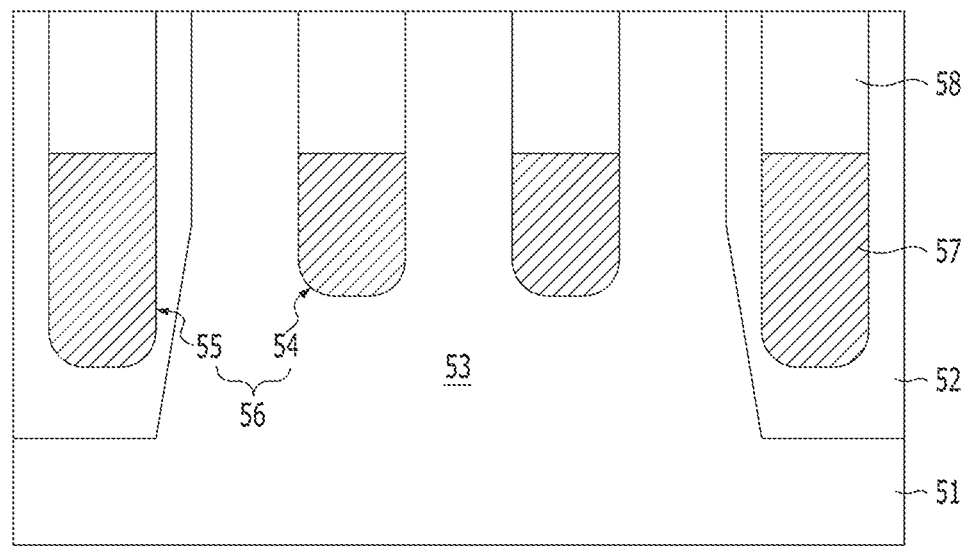
FIGS. 6A to 6E are process-sectional views illustrating a method for fabricating an electronic device including buried gates in accordance with another implementation of this patent document.

As shown in FIG. 6A, isolation layers 52 that define an active region 53 are formed in a substrate 51. The substrate 51 can include single crystalline silicon. The isolation layers 52 can be formed by a shallow trench isolation (STI) process and can include an oxide layer or a nitride layer.

A plurality of trenches 56 is formed by selectively etching the substrate 51. The etch process for forming the trenches 56 can include anisotropic etch. The trenches 56 can have a line pattern that intersects both the active region 53 and the isolation layers 52. The trenches 56 can include first trenches 54 formed in the active region 53 and second trenches 55 formed in the isolation layers 52. The second trench 55 can have a greater depth than the first trench 54. If the second trench 55 has a greater depth than the first trench 54, the active region 53 having a fin structure under the first trenches 54 can be formed.

A gate insulating layer (not shown) is formed on a surface of each of the trenches 56. The gate insulating layer can be formed of an oxide layer. The gate insulating layer can be formed by an oxidization process including thermal oxidization or radical oxidization.

Next, gate electrodes 57, each burying part of the trench 56, are formed. Gate control capability can be improved because the gate electrodes 57 are configured to cover the active region 53 having a fin structure under the first trenches 54 in such a way as to bury or fill up both the first trenches 54 and the second trenches 55.

The gate electrode 57 can include a metallic layer. The gate electrode 57 can be formed by a series of processes for forming a gate conductive layer on the entire surface of the substrate 51 so that the trenches 56 are buried and then sequentially performing a polishing process and a blanket etch process. The polishing process can be performed using a chemical mechanical polishing (CMP) method, and the blanket etch process can be performed using etch-back.

Next, sealing layers 58, each burying or filling up the remaining trench 56, are formed over the respective gate electrodes 57. The sealing layer 58 can include an insulating layer. The sealing layer 58 can be formed of a single layer or a stack layer of two or more layers by using an oxide layer, a nitride layer, or an oxide nitride layer. The sealing layer 58 can be formed by a series of processes for forming an insulating layer on the entire surface of the substrate 51 so that the trenches 56 are buried or filled up and then a polishing process can be performed to expose a surface of the substrate 51. The polishing process can be performed using a chemical mechanical polishing (CMP) method or etch-back.

Upon completion of the above processing, the plurality of buried gates BG are formed and each BG includes the trench 56, the gate insulating layer (not shown), the gate electrode 57, and the sealing layer 58.

Figure 6B:
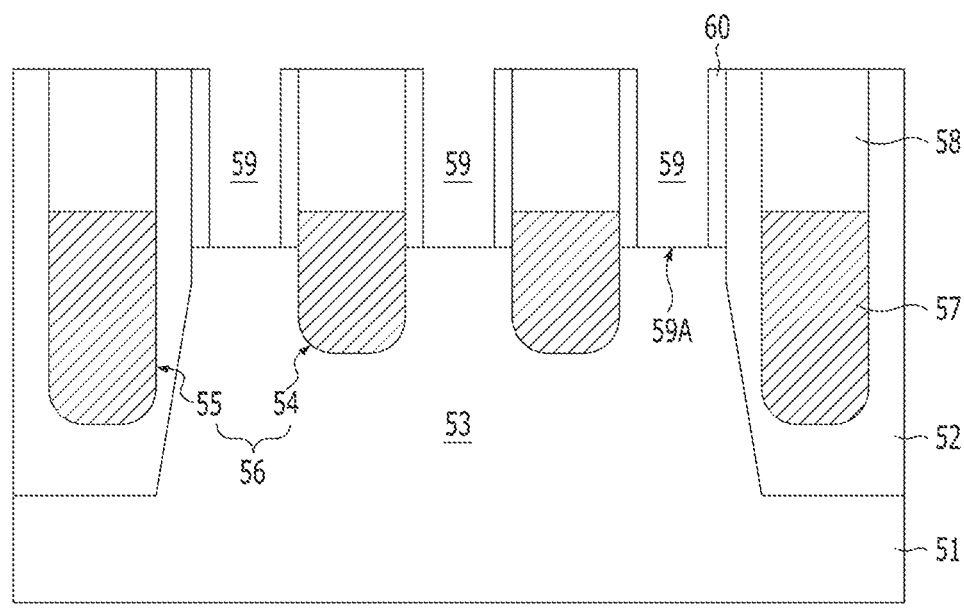

As shown in FIG. 6B, open parts 59 are formed by recessing the substrate 51 using the isolation layers 52 and the sealing layers 58 as etch barriers. Here, the bottom 59A of the first open part 59 is formed to be lower than the sealing layer 58 comes in contact with the gate electrode 57. In this case, the volume of a source region or a drain region to be formed in a subsequent process can be reduced, and the volume of a contact plug having low resistance can be maximized by the reduced volume of the source region or the drain region.

Spacers 60 are formed on both sidewalls of the open part 59. The spacer 60 functions to separate an ohmic contact layer and a contact plug to be formed in a subsequent process from the buried gate BG. In particular, the spacer 60 functions as an isolation layer for separating the gate electrodes 57. To this end, the spacer 60 can be formed of an insulating layer. The spacer 60 can include an oxide layer, a nitride layer, or an oxide nitride layer. The spacers 60 can be formed by forming an insulating layer having a constant thickness on a surface of the structure including the open parts 59 and then performing a blanket etch process, for example, etch-back.

Figure 6C:
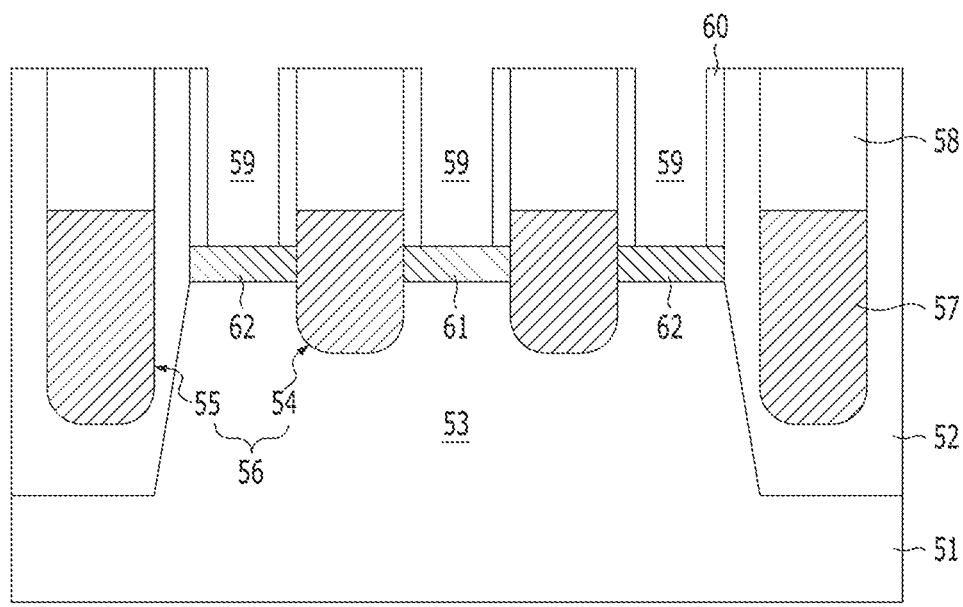

As shown in FIG. 6C, source and drain regions 61 and 62 are formed by ion-implanting impurities into the active region 53 under the open parts 59 and then performing anneal. N-type impurities, such as phosphorous (P) or arsenic (As), or P-type impurities, such as boron (B), can be used as the impurities for forming the source and drain regions 61 and 62. The impurities for forming the source and drain regions 61 and 62 can be selected depending on the characteristics of an electronic device. The anneal for activating the implanted impurities can be rapid thermal anneal. The source and drain regions 61 and 62 are configured to partially overlap with the gate electrodes 57 in a lateral direction.

The volume of the source or drain region 61 or 62 can be reduced as compared with the comparison example because the source and drain regions 61 and 62 are formed after forming the open parts 59. This means that a space where a contact plug will be formed by a subsequent process is increased. That is, a signal transfer characteristic of the electronic device can be improved because a space where a contact plug including materials having lower resistance than those of the source or drain region 61 or 62 is increased.

Figure 6D:
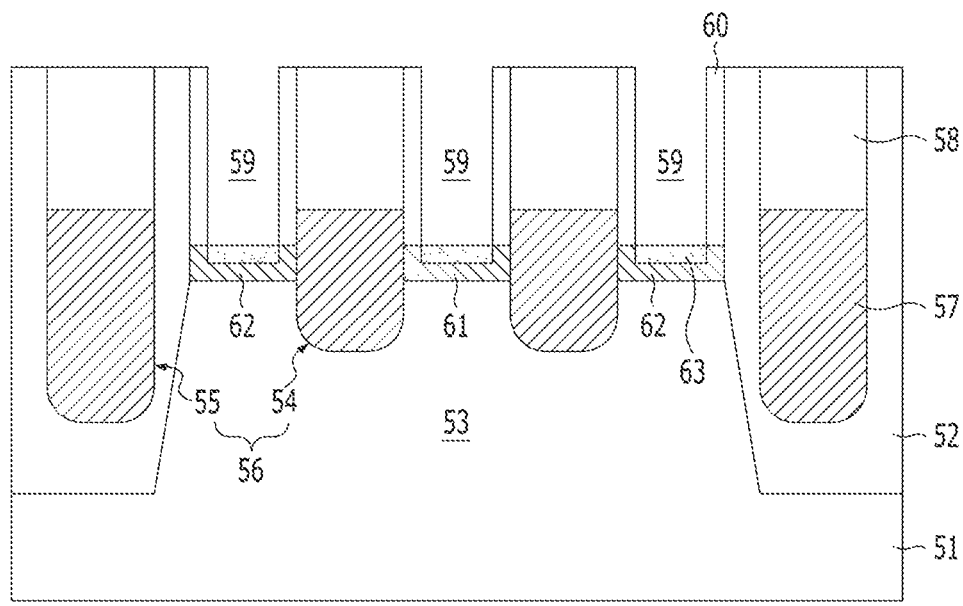

As shown in FIG. 6D, ohmic contact layers 63 are formed in surfaces of the source and drain regions 61 and 62 exposed to the open parts 59. The ohmic contact layer 63 can include silicide.

The ohmic contact layers 63 can be formed by a series of processes for forming a metal-containing layer (not shown) on a surface of the substrate 51, forming silicide by a reaction of the metal-containing layer with the substrate 51 through anneal, and then removing the metal-containing layer that has not reacted. The metal-containing layer can include metal, such as a near-noble metal or refractory metal. More particularly, the metal-containing layer can include cobalt (Co), titanium (Ti), tantalum (Ta), nickel (Ni), tungsten (W), platinum (Pt), or palladium (Pd). The annealing can be a rapid thermal annealing process and can be performed at a different temperature depending on the type (or materials) of metal-containing layer and substrate 51. In some implementations, the annealing may be performed several times at different temperatures depending on the type (or materials) of metal-containing layer and substrate 51. The metal-containing layer that has not reacted can be removed using a mixed chemical of sulphuric acid ($H_2SO_4$) and hydrogen peroxide ($H_2O_2$).

Figure 6E:
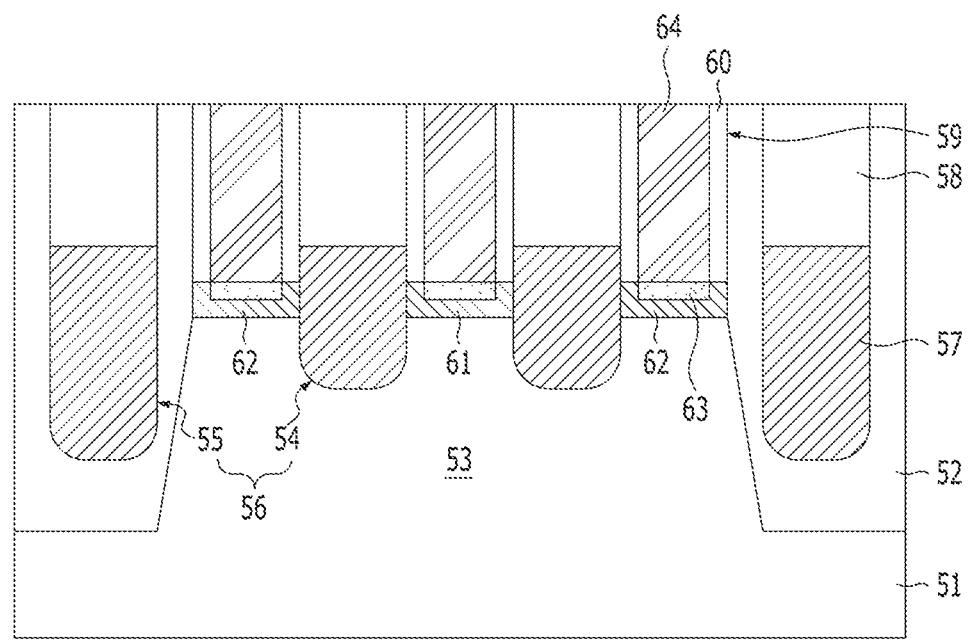

As shown in FIG. 6E, a plurality of contact plugs 64 is formed by forming conductive materials on the entire surface of the substrate 51 so that the open parts 59 are buried or filled up and then a polishing process is performed to expose the sealing layers 58. The polishing process can be performed using a chemical mechanical polishing (CMP) method. The contact plug 64 is made of conductive materials having lower resistance than those of the source or drain region 61 or 62. More particularly, the contact plug 64 can be formed of a metallic layer.

The volume of the contact plug 64 can be significantly increased as compared with the comparison example because the contact plug 64 is configured to bury the open part 59, with the result that a signal transfer characteristic of the electronic device can be improved. Furthermore, since the spacers 60 functioning as isolation layers are formed between the sidewalls of the open parts 59 and the sidewalls of the buried gates BG, the deterioration of the characteristics of the electronic device that may occur because the ohmic contact layer 63 and the contact plug 64 come in contact with the gate electrode 57 can be prevented.

The disclosed buried gates in this document can be applied to various electronic devices, including an electronic device for storing data or information using a characteristic in which the electronic device switches between different resistance states in response to voltage or a current. Such storage devices can be used in various electronic devices or systems, such as computers and mobile communication devices, as described below with reference to FIGS. 7A and 7B.

Figure 7A:
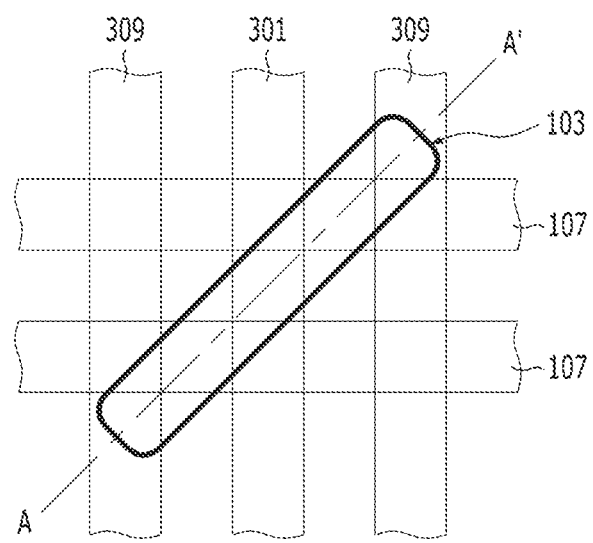
FIGS. 7A and 7B are diagrams showing an electronic device in accordance with an implementation of this patent document.
Figure 7B:
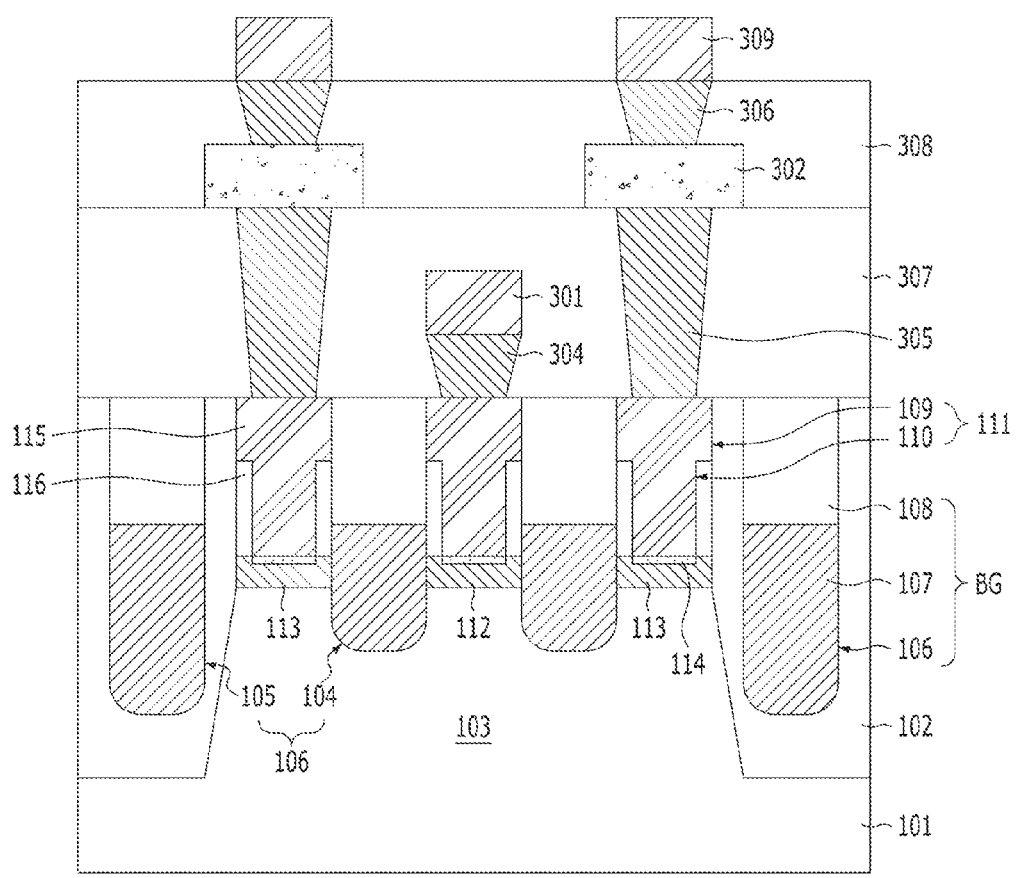

FIGS. 7A and 7B are diagrams showing an electronic device in which FIG. 7A is a plan view of the electronic device, and FIG. 7B is a cross-sectional view of the electronic device taken along line A-A' in FIG. 7A.

As shown in FIGS. 7A and 7B, an active region 103 is defined by isolation layers 102 formed in a substrate 101, and a plurality of buried gates BG is formed in the substrate 101. The buried gates BG have a line form extending in one direction and function as word lines. Each of the buried gate BG can include a trench 106 formed in the substrate 101, a gate insulating layer (not shown) formed on a surface of the trench 106, a gate electrode 107 formed on the gate insulating layer and configured to bury or fill up part of the trench 106, and a sealing layer 108 formed on the gate electrode 107 and configured to bury or fill up the remaining trench 106.

Open parts 111, each including a first open part 109 and a second open part 110, are formed in the substrate 101 on both side of the buried gate BG. Isolation layers 116 are disposed between the sidewalls of the open parts 111 and the sidewalls of the buried gates BG.

Source/drain regions 112 and 113 are formed in the substrate 101 under the open parts 111. The source region 112 may be placed in the center of the active region 103, and the drain regions 113 may be placed at the edges of the active region 103 on both sides. Accordingly, the source region 112 may be a common terminal.

Ohmic contact layers 114 are formed in surfaces of the source/drain regions 112 and 113 exposed to the respective open parts 111, and contact plugs 115 are buried in the respective open parts 111. The contact plug 115 can include a metallic layer, and the ohmic contact layer 115 can include a silicide.

A first interlayer insulating layer 307 is formed on the entire surface of the substrate 101. A source line 301 extended in a direction that crosses the buried gates BG is formed within the first interlayer insulating layer 307. The source line 301 is coupled with the contact plug 115 coupled with the source region 112 and a first plug 304. Furthermore, second plugs 305 are formed within the first interlayer insulating layer 307 and are configured to come in contact with the contact plugs 115 coupled with the respective drain regions 113 through the first interlayer insulating layer 307.

Storage devices or elements 302 configured to come in contact with the second plugs 305 and a second interlayer insulating layer 308 configured to cover the storages 302 are formed on the first interlayer insulating layer 307. Bit lines 309 extended in a direction that cross the buried gates BG are formed on the second interlayer insulating layer 308 and are coupled with the respective storages 302 through third plugs 306.

Each storage device or element 302 functions to store logic information and can include a variable resistance element. The variable resistance element can have a structure in which a first electrode, a variable resistance layer, and a second electrode are stacked. The variable resistance element can have a characteristic in which the variable resistance element switches between different resistance states (or different resistance values) in response to a bias (for example, voltage or a current) applied through the first electrode or the second electrode or both.

The variable resistance layer in the storage device or element 302 has a variable resistance characteristic in response to a bias applied through the first electrode or the second electrode or both and can include a single layer or multiple layers. For example, the variable resistance layer can include phase-change materials. The phase-change materials can include a chalcogen compound. The phase-change materials have a crystalline state changed into an amorphous state or a crystal state in response to an external stimulus (for example, voltage or a current) and can have a characteristic in which the phase-change materials switch between different resistance states. Furthermore, the variable resistance layer can include metal oxide. The metal oxide can include transition metal oxide (TMO) or oxide based on perovskite or the like. The metal oxide includes intra-film vacancies and can have a characteristic in which the metal oxide switches between different resistance states depending on the creation and distinction of a conductive path according to the behavior of the vacancies in response to an external stimulus. Furthermore, the variable resistance layer can include a stack layer in which a tunnel barrier layer is interposed between two magnetic material layers. The stack layer having the tunnel barrier layer interposed between the two magnetic material layers is also called a magnetic tunnel junction (MTJ). The stack layer having the tunnel barrier layer interposed between the two magnetic material layers can have a characteristic in which the stack layer switches different resistance states depending on magnetization directions of the two magnetic material layers. For example, if the two magnetic material layers have the same magnetization direction (or have parallel magnetization directions), the two magnetic material layers can have a low-resistance state. If the two magnetic material layers have different magnetization directions (or do not have parallel magnetization directions), the two magnetic material layers can have a high-resistance state. The above MTJ structure is one of various implemenations for achieving a variable resistance characteristic in which the variable resistance layer can switch between different resistance states in response to a bias applied to the first electrode or the second electrode or both. Other implementations are possible.

Most of electronic devices capable of storing information adopt a method using the storage of charges. The method using the storage of charges is reaching a limit due to a data error problem because the critical dimension is reduced at high speed. In order to solve this problem, a resistance storage device for securing a sensing current using a change of resistance is actively developed. The resistance storage device is disadvantageous in that it has operating characteristics greatly dependent on resistance components of an element unlike a device for storing logic information using charges.

If an electronic device including contact parts including the source/drain regions 112 and 113 and the contact plugs 115 in accordance with an implementation of this patent document is used, however, resistance of the contact part can be greatly reduced. In this case, operating characteristics can be significantly improved if the electronic device is applied to a device using a change of resistance.

As described above, the depth of the open parts in which the contact plugs are formed can be increased because the isolation layers are disposed between the sidewalls of the open parts and the sidewalls of the buried gates. Accordingly, this technology is advantageous in that a signal transfer characteristic can be improved and the deterioration of characteristics and reliability attributable to the overlapping of the contact plug with the buried gate can be prevented.

The above and other memory circuits or semiconductor devices based on the disclosed technology can be used in a range of devices or systems. FIGS. 8-12 provide some examples of devices or systems that can implement the memory circuits disclosed herein.

Figure 8:
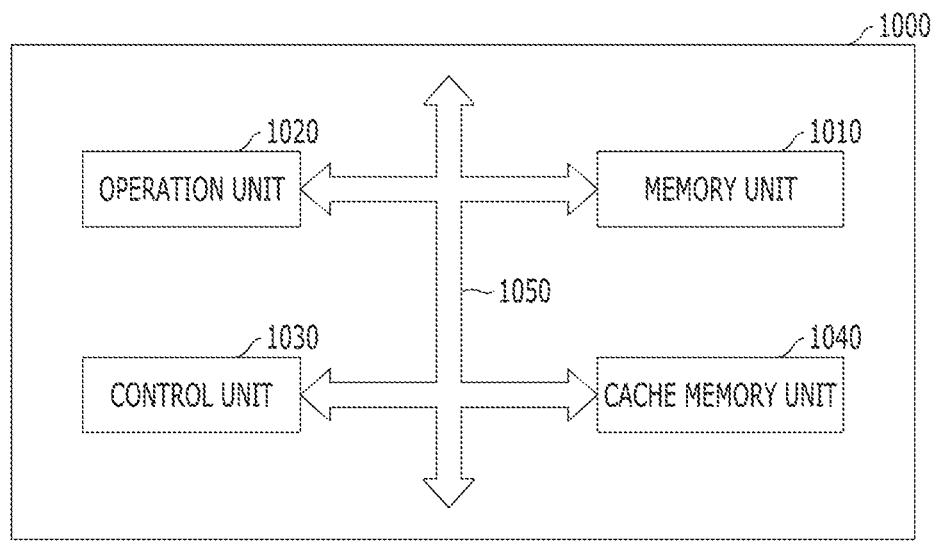
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of buried gates formed in a substrate; open parts formed in the substrate on both sides of the buried gate; isolation layers each formed between a sidewall of the open part and a sidewall of the buried gate; source/drain regions formed in the substrate under the respective open parts; and contact plugs buried in the respective open parts. Through this, the depth of the open parts in which the contact plugs are formed can be increased because the isolation layers are disposed between the sidewalls of the open parts and the sidewalls of the buried gates. Accordingly, this technology is advantageous in that a signal transfer characteristic can be improved and the deterioration of characteristics and reliability attributable to the overlapping of the contact plug with the buried gate can be prevented. As a consequence, the microprocessor 1000 can improve a signal transfer characteristic the deterioration of characteristics and reliability can be prevented.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
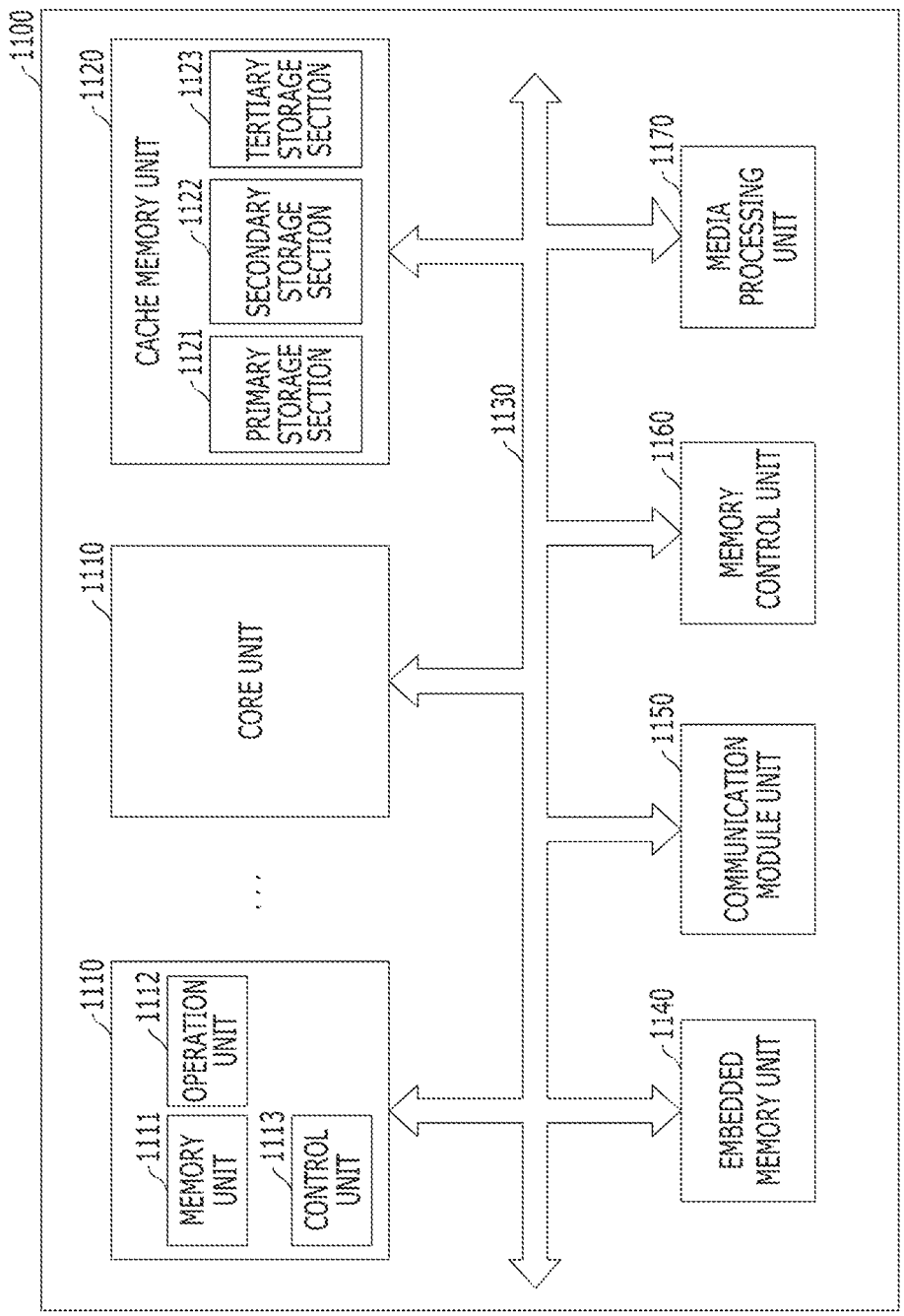
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 maymay include a plurality of buried gates formed in a substrate; open parts formed in the substrate on both sides of the buried gate; isolation layers each formed between a sidewall of the open part and a sidewall of the buried gate; source/drain regions formed in the substrate under the respective open parts; and contact plugs buried in the respective open parts. Through this, the depth of the open parts in which the contact plugs are formed can be increased because the isolation layers are disposed between the sidewalls of the open parts and the sidewalls of the buried gates. Accordingly, this technology is advantageous in that a signal transfer characteristic can be improved and the deterioration of characteristics and reliability attributable to the overlapping of the contact plug with the buried gate can be prevented. As a consequence, the processor 1100 can improve a signal transfer characteristic the deterioration of characteristics and reliability can be prevented.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
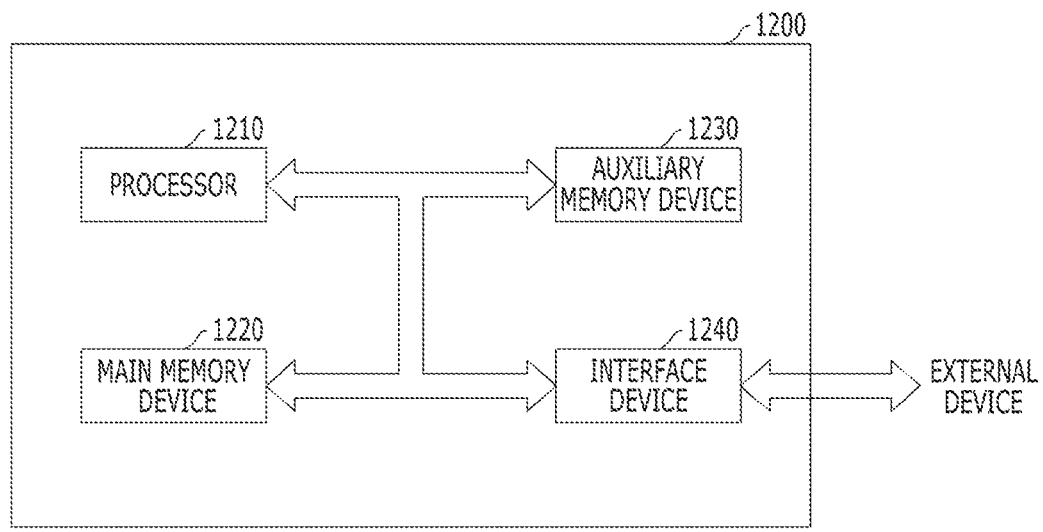
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may may include a plurality of buried gates formed in a substrate; open parts formed in the substrate on both sides of the buried gate; isolation layers each formed between a sidewall of the open part and a sidewall of the buried gate; source/drain regions formed in the substrate under the respective open parts; and contact plugs buried in the respective open parts. Through this, the depth of the open parts in which the contact plugs are formed can be increased because the isolation layers are disposed between the sidewalls of the open parts and the sidewalls of the buried gates. Accordingly, this technology is advantageous in that a signal transfer characteristic can be improved and the deterioration of characteristics and reliability attributable to the overlapping of the contact plug with the buried gate can be prevented. As a consequence, the system 1200 can improve a signal transfer characteristic the deterioration of characteristics and reliability can be prevented.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may may include a plurality of buried gates formed in a substrate; open parts formed in the substrate on both sides of the buried gate; isolation layers each formed between a sidewall of the open part and a sidewall of the buried gate; source/drain regions formed in the substrate under the respective open parts; and contact plugs buried in the respective open parts. Through this, the depth of the open parts in which the contact plugs are formed can be increased because the isolation layers are disposed between the sidewalls of the open parts and the sidewalls of the buried gates. Accordingly, this technology is advantageous in that a signal transfer characteristic can be improved and the deterioration of characteristics and reliability attributable to the overlapping of the contact plug with the buried gate can be prevented. As a consequence, the system 1200 can improve a signal transfer characteristic the deterioration of characteristics and reliability can be prevented.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
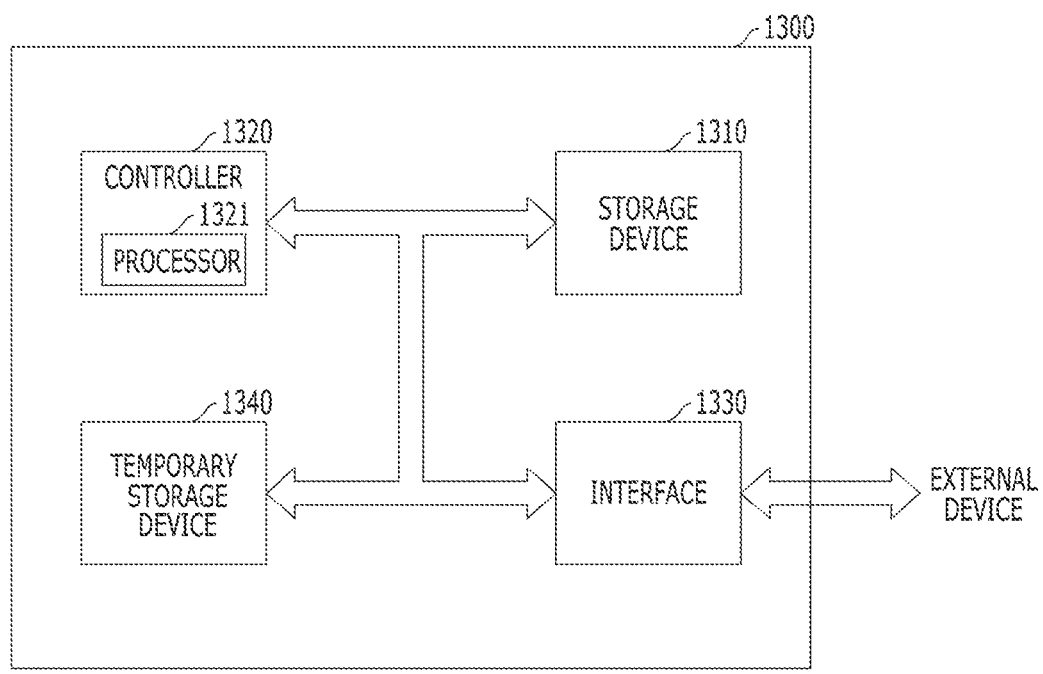
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a resistance variable element which includes a free magnetic layer, a tunnel barrier layer and a pinned magnetic layer, and a magnetic correction layer which is disposed over the resistance variable element to be separated from the resistance variable element and has a magnetization direction opposite to a magnetization direction of the pinned magnetic layer. Through this, a fabrication process of the storage device 1310 or the temporary storage device 1340 may become easy and the reliability of the storage device 1310 or the temporary storage device 1340 may be improved. As a consequence, a fabrication process of the data storage system 1300 may become easy and the reliability of the data storage system 1300 may be improved.

Figure 12:
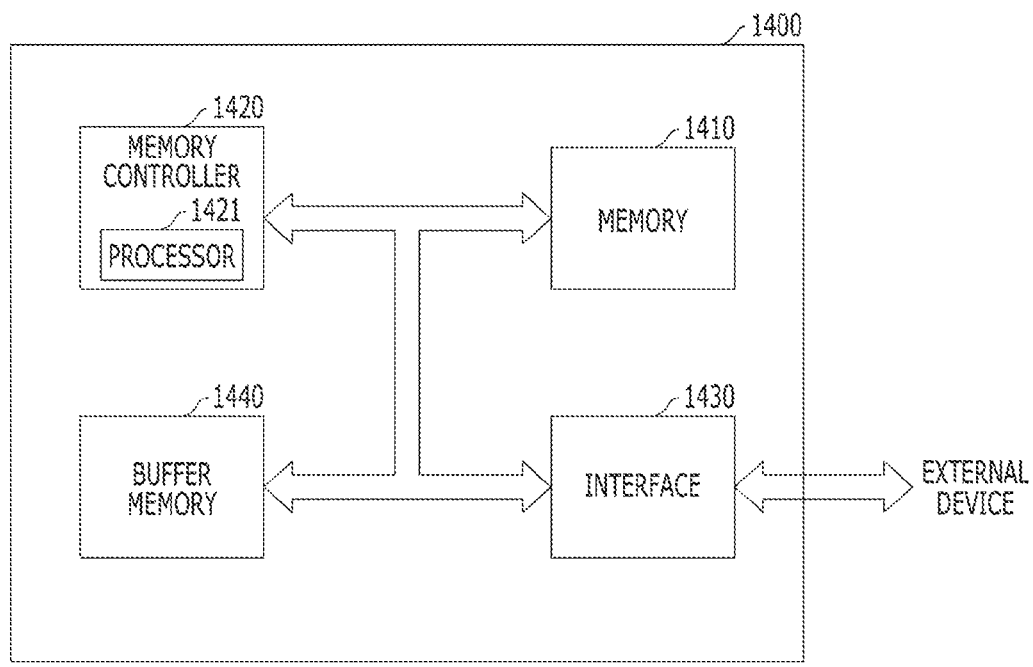
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may may include a plurality of buried gates formed in a substrate; open parts formed in the substrate on both sides of the buried gate; isolation layers each formed between a sidewall of the open part and a sidewall of the buried gate; source/drain regions formed in the substrate under the respective open parts; and contact plugs buried in the respective open parts. Through this, the depth of the open parts in which the contact plugs are formed can be increased because the isolation layers are disposed between the sidewalls of the open parts and the sidewalls of the buried gates. Accordingly, this technology is advantageous in that a signal transfer characteristic can be improved and the deterioration of characteristics and reliability attributable to the overlapping of the contact plug with the buried gate can be prevented. As a consequence, the memory system 1400 can improve a signal transfer characteristic the deterioration of characteristics and reliability can be prevented.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a resistance variable element which includes may include a plurality of buried gates formed in a substrate; open parts formed in the substrate on both sides of the buried gate; isolation layers each formed between a sidewall of the open part and a sidewall of the buried gate; source/drain regions formed in the substrate under the respective open parts; and contact plugs buried in the respective open parts. Through this, the depth of the open parts in which the contact plugs are formed can be increased because the isolation layers are disposed between the sidewalls of the open parts and the sidewalls of the buried gates. Accordingly, this technology is advantageous in that a signal transfer characteristic can be improved and the deterioration of characteristics and reliability attributable to the overlapping of the contact plug with the buried gate can be prevented. Through this, a fabrication process of the buffer memory 1440 may become easy and the reliability of the buffer memory 1440 may be improved. As a consequence, the memory system 1400 can improve a signal transfer characteristic the deterioration of characteristics and reliability can be prevented.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

As is apparent from the above descriptions, in the semiconductor device and the method for fabricating the same in accordance with the implementations, patterning of a resistance variable element is easy, and it is possible to secure the characteristics of the resistance variable element.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory unit that includes:
   a plurality of buried gates formed in a substrate;
   open parts formed in the substrate on both sides of the buried gates and each open part having a predetermined depth into the substrate along a direction perpendicular to a surface of the substrate;
   isolation layers each formed between a sidewall of the open part and a sidewall of the buried gate;
   source and drain regions formed in the substrate under respective open parts; and
   contact plugs filled in respective open parts and buried in the substrate.

2. The electronic device of claim 1, further comprising an ohmic contact layer between a contact plug in an open part and a source or drain region under the open part.

3. The electronic device according to claim 1, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory unit that includes the resistance variable element is part of the cache memory unit in the processor.

4. The electronic device according to claim 1, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory unit that includes the resistance variable element is part of the storage device or the temporary storage device in the data storage system.

5. The electronic device of claim 1, wherein each of the buried gates comprises:
   a trench formed in the substrate;
   a gate insulating layer formed on a surface of the trench;
   a gate electrode formed over the gate insulating layer and configured to bury part of the trench; and
   a sealing layer formed over the gate electrode and configured to bury the remaining trench.

6. The electronic device of claim 5, wherein a bottom of the open part is lower than an interface where the gate electrode comes in contact with the sealing layer.

7. The electronic device of claim 1, wherein the open parts comprise:
   first open parts formed in the substrate on both sides of the buried gate and each configured to have a first critical dimension; and
   second open parts formed under the first open parts and each configured to have a second critical dimension smaller than the first critical dimension.

8. The electronic device of claim 7, wherein the isolation layer comprises a substrate remaining between a sidewall of the second open part and a sidewall of the buried gate.

9. A method for fabricating an electronic device having a semiconductor memory unit, comprising:
   forming a plurality of buried gates in a substrate;
   forming first open parts, each having a first critical dimension, by etching the substrate on both sides of the buried gate;
   forming spacers on both sidewalls of the first open part;
   forming second open parts, each having a second critical dimension smaller than the first critical dimension, by etching the substrate under the first open parts using the spacers as etch barriers;
   forming source/drain regions in the substrate under the second open parts; and
   forming contact plugs configured to bury the first and the second open parts.

10. The method of claim 9, wherein the forming of the second open parts comprises forming the second open parts so that the substrate remains between a sidewall of the second open part and a sidewall of the buried gate.

11. The method of claim 9, further comprising forming ohmic contact layers in surfaces of the source/drain regions exposed to the second open parts before forming the contact plugs.

12. The method of claim 11, wherein the forming of the ohmic contact layers comprises:
    forming discontinuous metal-containing layers on an entire surface of the substrate;
    forming silicide in the source/drain regions coming in contact with the metal-containing layers by performing anneal; and
    removing metal-containing layers that have not reacted.

13. The method of claim 12, wherein the forming of the discontinuous metal-containing layers on the entire surface of the substrate is performed using a physical vapor deposition method.

14. The method of claim 9, wherein the forming of the buried gates comprises:
    forming trenches by selectively etching the substrate;
    forming a gate insulating layer on a surface of each of the trenches;
    forming a gate electrode formed over the gate insulating layer and configured to bury part of the trench; and
    forming sealing layers each formed over the gate electrode and configured to bury a remaining trench.

15. The method of claim 14, wherein the forming of the first open parts comprises forming the first open parts so that a bottom of the first open part is higher than an interface where the gate electrode comes in contact with the sealing layer.

16. The method of claim 14, wherein the forming of the second open parts comprises forming the second open parts so that a bottom of the second open part is lower than an interface where the gate electrode comes in contact with the sealing layer.

17. A method for fabricating an electronic device having a semiconductor memory unit, comprising:
    forming a plurality of buried gates in a substrate;
    forming open parts by etching the substrate on both sides of the buried gate;
    forming isolation layers on both sidewalls of the open part;
    forming source/drain regions in the substrate under the open parts; and
    forming contact plugs each configured to bury the open part.

18. The method of claim 17, further comprising forming ohmic contact layers in surfaces of the source/drain regions exposed to the second open parts before forming the contact plugs.

19. The method of claim 17, wherein the forming of the buried gates comprises:
    forming trenches by selectively etching the substrate;
    forming a gate insulating layer on a surface of each of the trench;
    forming a gate electrode formed over the gate insulating layer and configured to bury part of the trench; and
    forming sealing layers each formed over the gate electrode and configured to bury a remaining trench.

20. The method of claim 19, wherein the forming of the open parts comprises forming the open parts so that a bottom of the open part is lower than an interface where the gate electrode comes in contact with the sealing layer.

* * * * *